US006658613B2

(12) United States Patent
Rearick et al.

(10) Patent No.: US 6,658,613 B2
(45) Date of Patent: Dec. 2, 2003

(54) SYSTEMS AND METHODS FOR FACILITATING TESTING OF PAD RECEIVERS OF INTEGRATED CIRCUITS

(75) Inventors: Jeffrey R. Rearick, Fort Collins, CO (US); John G. Rohrbaugh, Fort Collins, CO (US); Shad Shepston, Firestone, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 433 days.

(21) Appl. No.: 09/813,752

(22) Filed: Mar. 21, 2001

(65) Prior Publication Data

US 2002/0135391 A1 Sep. 26, 2002

(51) Int. Cl.[7] .............................. G01R 31/28; G04F 1/00
(52) U.S. Cl. ......................................... 714/724; 702/177
(58) Field of Search ................................ 714/724, 733, 714/734, 811, 814; 702/176, 177, 187

(56) References Cited

U.S. PATENT DOCUMENTS

| 5,481,550 | A | * | 1/1996 | Garcia et al. ................ 714/744 |
| 5,682,392 | A | | 10/1997 | Raymond et al. |
| 5,796,260 | A | | 8/1998 | Agan |
| 5,977,775 | A | | 11/1999 | Chandler et al. |
| 6,275,962 | B1 | | 8/2001 | Fuller et al. |
| 6,324,485 | B1 | | 11/2001 | Ellis |
| 6,365,859 | B1 | | 4/2002 | Yi et al. |
| 6,396,279 | B1 | | 5/2002 | Gruenert |
| 6,397,361 | B1 | | 5/2002 | Saitoh |
| 6,449,742 | B1 | * | 9/2002 | Arabi et al. ................ 714/735 |
| 2001/0005132 | A1 | * | 6/2001 | Nishikawa et al. ...... 324/158.1 |

OTHER PUBLICATIONS

Haulin, Tord, "Built–in Parametric Test for Controlled Impedance I/Os," Ericsson Telecom, S–126 25 Stockholm, Sweden, pp. 123–128.

Niggemeyer, M. Ruffer, "Parametric Built–In Self Test of VLSI Systems," Laboratory for Information Technology, University of Hannover, Germany.

\* cited by examiner

Primary Examiner—Christine T. Tu

(57) ABSTRACT

A preferred integrated circuit (IC) includes a first pad electrically communicating with at least a portion of the IC. The first pad includes a first driver and a first receiver, with the first driver being configured to provide a first pad output signal to a component external to the IC, and the first receiver being configured to receive a first pad input signal from a component external to the IC. The first receiver also is configured to provide, to a component internal to the IC, a first receiver digital output signal in response to the first pad input signal. A first test circuit also is provided that is internal to the IC. The first test circuit is adapted to provide information corresponding to the receiver setup time and/or the receiver hold time of the first pad. Systems and methods also are provided.

17 Claims, 13 Drawing Sheets

SYSTEMS AND METHODS FOR FACILITATING TESTING OF PAD RECEIVERS OF INTEGRATED CIRCUITS

BACKGROUND OF THE INVENTION

1. Field of the Invention

The present invention generally relates to integrated circuits and, in particular, to systems and methods for facilitating, within an integrated circuit, receiver set-up and/or hold time testing of pads of the integrated circuit.

2. Description of the Related Art

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing IC's, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and other shortcomings of the prior art.

SUMMARY OF THE INVENTION

Briefly described, the present invention provides receiver set-up and/or hold time testing functionality within integrated circuits. In this regard, some embodiments of the present invention may be construed as providing integrated circuits (IC's). In a preferred embodiment, the integrated circuit includes a first pad electrically communicating with at least a portion of the IC. The first pad includes a first driver and a first receiver, with the first driver being configured to provide a first pad output signal to a component external to the IC, and the first receiver being configured to receive a first pad input signal from a component external to the IC. The first receiver also is configured to provide, to a component internal to the IC, a first receiver digital output signal in response to the first pad input signal. A first test circuit also is provided that is internal to the IC. The first test circuit is adapted to provide information corresponding to the receiver setup time and/or the receiver hold time of the first pad.

Some embodiments of the present invention may be construed as providing systems for measuring setup time and/or hold time of one or more of the receivers of an integrated circuit. In this regard, a preferred system includes an IC and ATE. The ATE is configured to electrically interconnect with the IC and to provide at least one stimulus to the IC. The IC includes a first pad that incorporates a first driver, a first receiver, and a first test circuit. So configured, the first test circuit may electrically communicate with the ATE so that, in response to receiving at least one stimulus from the ATE, the first test circuit provides information corresponding to the receiver setup time and/or the receiver hold time of the first receiver to the ATE.

Some embodiments of the present invention may be construed as providing methods for testing an IC. In this regard, a preferred method includes the steps of: electrically interconnecting ATE with the IC; providing at least one stimulus such that the IC measures a receiver setup time and receiver hold time of the first pad; and receiving information corresponding to the receiver setup time and the receiver hold time of the first pad.

Other embodiments of the present invention may be construed as providing computer readable media. In this regard, a preferred computer readable medium, which incorporates a computer program for facilitating measuring setup time and/or hold time of one or more of the receivers of an IC includes logic configured to enable ATE to provide at least one stimulus to the IC. Additionally, logic configured to enable the ATE to receive information corresponding to the receiver setup time and/or the receiver hold time of a first receiver of the IC is provided.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF A PREFERRED EMBODIMENT

Figure 1:
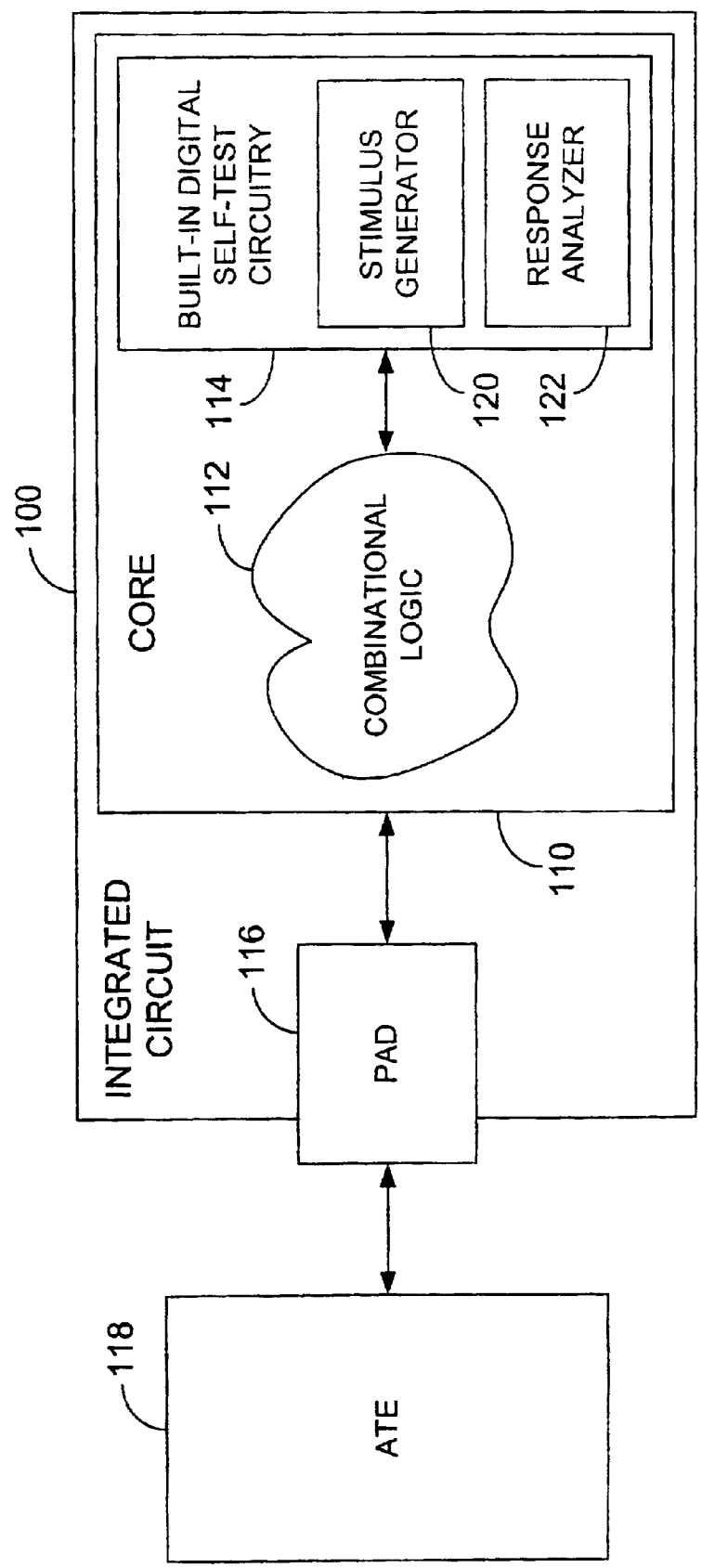
FIG. 1 is a schematic diagram depicting a representative integrated circuit incorporating digital self-test circuitry of the prior art.

Reference will now be made in detail to the description of the invention as illustrated in the drawings with like numerals indicating like parts throughout the several views. As mentioned briefly hereinbefore, it is known to incorporate built-in (digital) self test circuitry into an integrated circuit. Referring now to FIG. 1, a representative integrated circuit 100 incorporating such built-in self-test circuitry will be described in greater detail.

As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry are comprised of digital data, i.e., zeros and ones. In response to the various patterns, the logic circuitry under test then provides a response signal or signals to the response analyzer 122 which is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Figure 2:
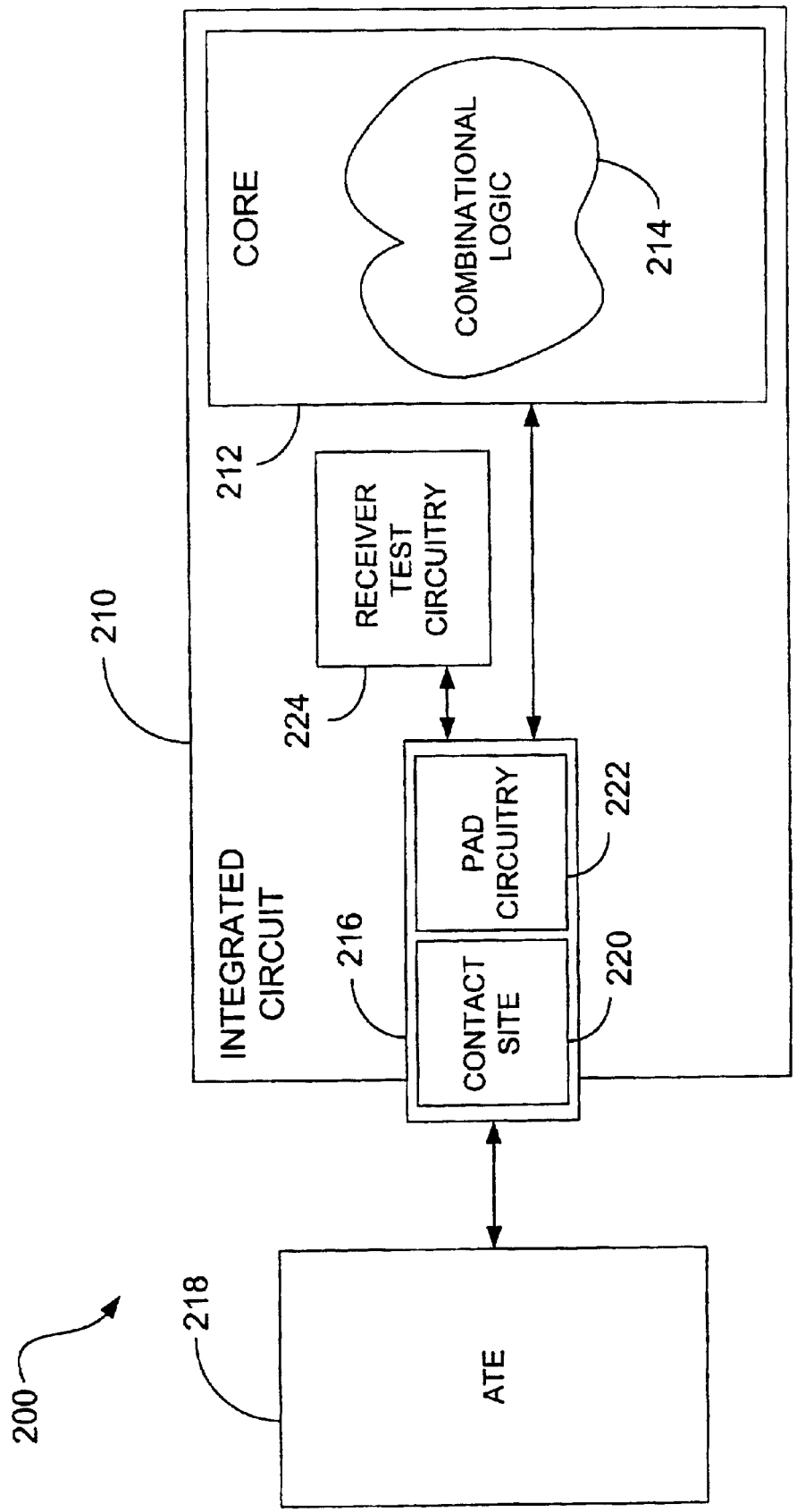
FIG. 2 is a schematic diagram depicting a preferred embodiment of the present invention.

Utilizing the digital self-test circuitry of FIG. 1 as a point of comparison, general characteristics of a preferred embodiment of the receiver test system of the present invention will now be described in reference to the schematic diagram of FIG. 2. As depicted in FIG. 2, receiver test system 200 incorporates an integrated circuit 210 which includes a core 212. Core 212 incorporates logic 214 and electrically communicates with a pad 216, which is configured to allow intercommunication of the logic with devices, such as ATE 218, for example, external to the integrated circuit. As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates receiver test circuitry 224 which electrically communicates, either directly or indirectly, with pad 216. As described in detail hereinafter, receiver test circuitry 224 is configured to provide selected ATE functionality and, thereby, potentially reduces the necessity for specialized external automated test equipment for testing integrated circuits of various configurations. It should be noted that, although receiver test circuitry 224 is depicted in FIG. 2 as residing outside core 212 and outside the pad 216, various other arrangements of test circuitry 224 may be utilized, such as arranging the test circuitry within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing receiver test circuitry "on-chip," the testing of integrated circuits, such as integrated circuit 210, may be implemented utilizing conventional ATE, whereby test capability not typically provided by the conventional ATE may be provided by the receiver test circuitry. So provided, the receiver test circuitry has the ability to provide testing capability that a given ATE does not provide, or is not able to provide, while utilizing various capabilities that a given ATE does provide. Thus, the testing system 200 of the present invention may facilitate efficient and effective testing of integrated circuits that draws from at least some of the inherent strengths of conventional ATE, e.g., reduced costs, while providing potentially improved testing performance.

By utilizing the receiver test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the receiver test circuitry. Additionally, utilization of the receiver test circuitry makes it possible to test the integrated circuits at frequencies greater than the test frequency limit of the ATE.

As mentioned hereinbefore, the present invention facilitates receiver set-up time ($T_{setup}$) and/or hold time ($T_{hold}$) testing of pads of integrated circuits and, in preferred embodiments, facilitates such testing, at least in part, with the use of "on-chip" components. As utilized herein, the term "receiver set-up time" refers to the time interval during which data typically must be valid before a capture clock edge for the data to be correctly captured, and the term "receiver hold time" refers to the time interval during which data typically must be valid after a capture clock edge for the data to be correctly captured. More specifically, for data to be correctly captured, the data typically must be valid for $T_{setup}$ prior to a rising edge of the clock and typically must remain at that value for $T_{hold}$ afterwards. If, however, the data changes less than $T_{setup}$ prior to the rising edge of the clock, the previous data value may be captured instead of the desired data value. Additionally, if the data changes less than $T_{hold}$ after the rising edge of the clock, a new data value may be captured instead of the desired data value.

Figure 3:
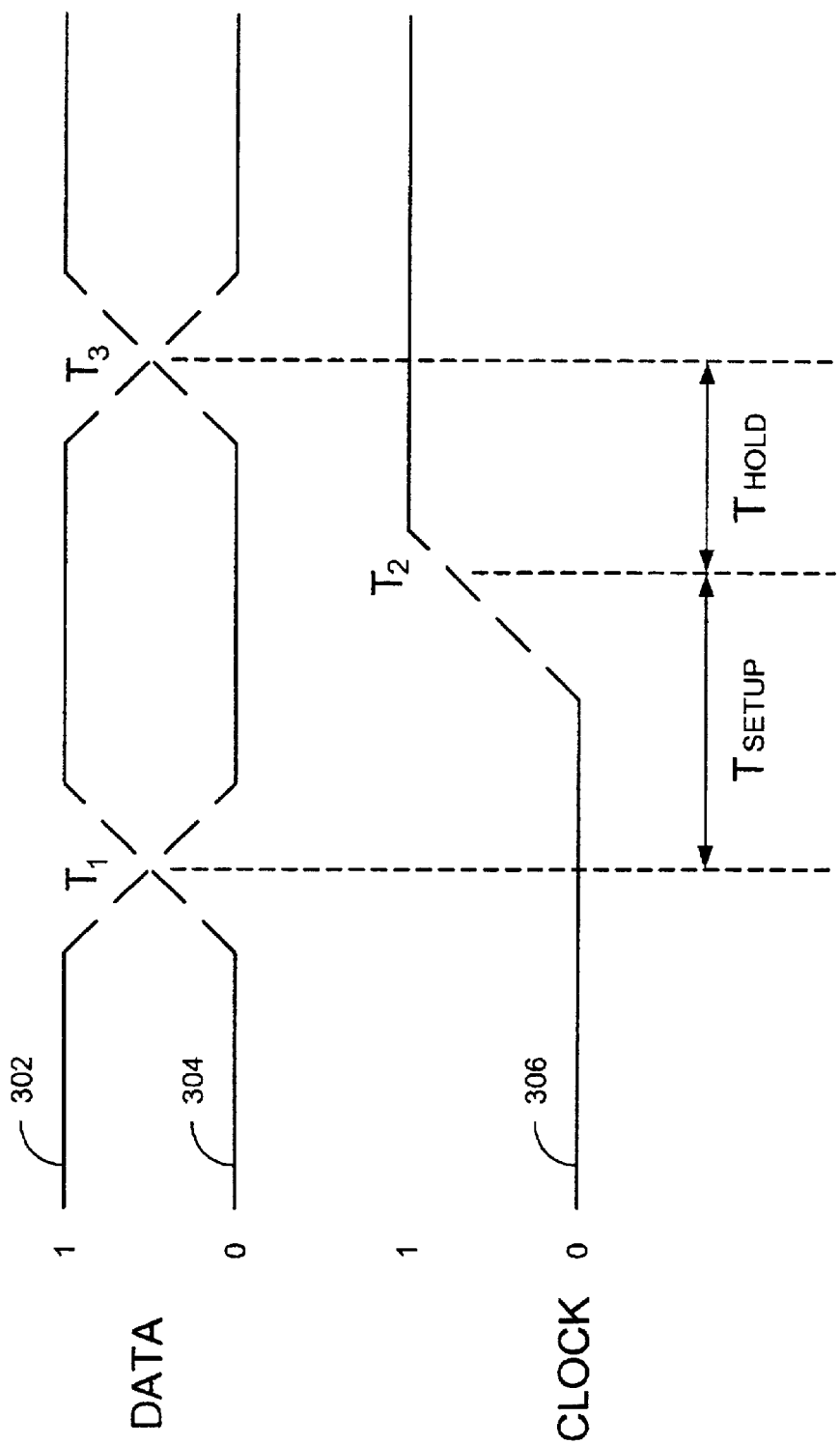
FIG. 3 is a timing diagram depicting representative receiver setup ($T_{setup}$) and hold ($T_{hold}$) times.

A graphical depiction of $T_{setup}$ and $T_{hold}$ is presented in FIG. 3, wherein representative data signals 302 and 304 are shown transitioning between logic "0" and logic "1." A clock signal 306 also is depicted, with $T_{setup}$ and $T_{hold}$ being shown in relation to the clock and data signals. It should be noted that $T_{setup}$ is measured from $T_1$ to $T_2$ i.e., $T_1$ being where the data has transitioned from a first logic value to a valid second logic value, and $T_2$ being where the clock edge is rising. $T_{hold}$ is measured from $T_2$ to $T_3$, i.e., $T_3$ being where the data has transitioned from the second logic value to a valid third logic value.

Figure 4:
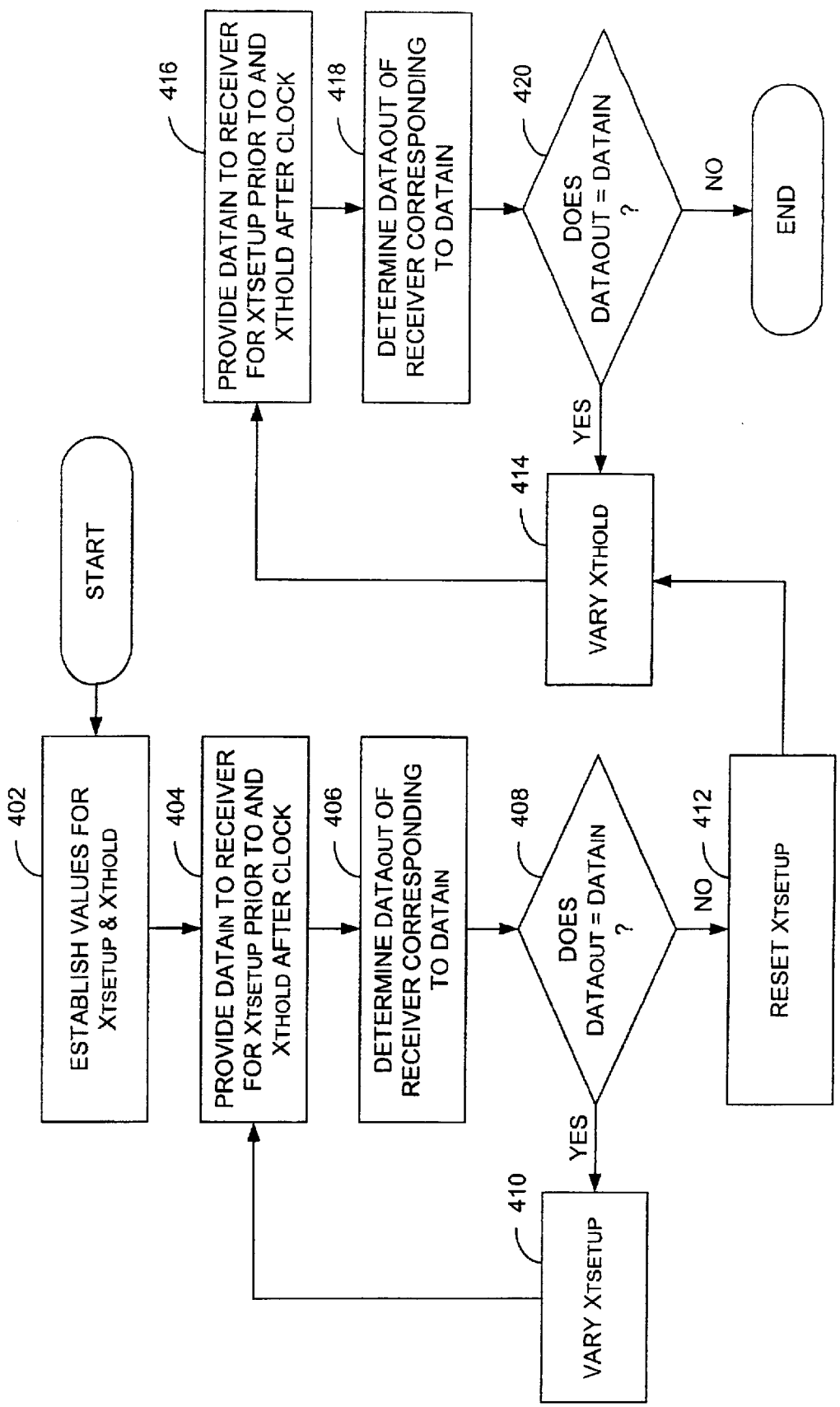
FIG. 4 is a flowchart depicting the functionality of a preferred embodiment of the present invention.

The flowchart of FIG. 4 shows the functionality and operation of a preferred implementation of the present invention. In this regard, the functions noted in the various blocks may occur out of the order depicted in FIG. 4. For example, two blocks shown in succession in FIG. 4 may, in fact, occur substantially concurrently or, in some embodiments, in the reverse order. As shown in FIG. 4, the embodiment or method depicted may be construed as beginning at block 402 where initial values for $XT_{setup}$ and $XT_{hold}$ are established. More specifically, $XT_{setup}$ and $XT_{hold}$ correspond to variable time periods for applying a signal to a pad receiver under test. The time periods of $XT_{setup}$ and $XT_{hold}$ are utilized by the present invention for determining actual $T_{setup}$ and $T_{hold}$ of the pad receiver as described hereinafter.

Proceeding to block 404, the receiver is provided with an input data signal ($DATA_{IN}$), i.e., a logic "0" or a logic "1," for a time period of $XT_{setup}$ prior to and continuing through a period $XT_{hold}$ after firing of a capture clock. After determining an output data signal of the receiver ($DATA_{OUT}$) corresponding to $DATA_{IN}$ (block 406), a determination may be made as to whether $DATA_{OUT}$ is equal to $DATA_{IN}$ (block 408). For example, if $DATA_{IN}$ is a logic "1," a determination is made as to whether $DATA_{OUT}$ is a logic "1". If it is determined that $DATA_{IN}$ is not equal to $DATA_{OUT}$, the process may proceed to block 410, where $XT_{setup}$ may be set to a different value than that previously established. Thereafter, the process may return to block 404 and proceed as described hereinbefore until $DATA_{IN}$ equals $DATA_{OUT}$. So provided, the aforementioned method steps 404–410 may be viewed as establishing the actual $T_{setup}$ of the receiver under test. In particular, $XT_{hold\ preferably}$ has been held constant while adjusting $XT_{setup}$ until $DATA_{IN}$ equals $DATA_{OUT}$, thus $T_{setup}$ corresponds to the value of $XT_{setup}$ resulting in $DATA_{IN}=DATA_{OUT}$.

The aforementioned utilization of $XT_{setup}$ assumes that the initial value for $XT_{setup}$ results in a $DATA_{IN}$ that is not equal to $DATA_{OUT}$. It should be noted that an initial value for $XT_{setup}$ may be utilized that results in a $DATA_{IN}$ that is equal to $DATA_{OUT}$. In these embodiments, $XT_{hold}$ may be held constant while adjusting $XT_{setup}$ until $DATA_{IN}$ does not equal $DATA_{out}$. Thus, $T_{setup}$ would correspond to the value of $XT_{setup}$ resulting in $DATA_{IN \neq} DATA_{OUT}$. Additionally, it should be noted that, in some embodiments, $T_{hold}$ may be determined prior to determining $T_{setup}$.

Referring back to FIG. 4, once it is determined that $DATA_{IN}$ is equal to $DATA_{OUT}$, the process may proceed to block 412, where $XT_{setup}$ may be reset to the previously established initial value. At block 414, $XT_{hold}$ may be set to a different value than that previously established. Proceeding to block 416, the receiver is provided with $DATA_{IN}$ for a time period of $XT_{setup}$ prior to and continuing through a period $XT_{hold}$ after firing of the capture clock. A determination then is made as to whether $DATA_{OUT}$ is equal to $DATA_{IN}$ (blocks 418 and 420). If it is determined that $DATA_{IN}$ is not equal to $DATA_{OUT}$, the process may proceed back to block 414, where $XT_{hold}$ may be set to a different value than previously established. Thereafter, the process may return to block 416 and proceed as described hereinbefore until $DATA_{IN}$ equals $DATA_{OUT}$. So provided, the aforementioned method steps 414–420 may be viewed as establishing the actual $T_{hold}$ of the receiver under test. In particular, $XT_{setup}$ preferably has been held constant while adjusting $XT_{hold}$ until $DATA_{IN}$ equals $DATA_{OUT}$, thus $T_{hold}$ corresponds to the value of $XT_{hold}$ resulting in $DATA_{IN}=DATA_{OUT}$.

The aforementioned utilization of $XT_{hold}$ assumes that the initial value for $XT_{hold}$ results in a $DATA_{IN}$ that is not equal to $DATA_{OUT}$. It should be noted that an initial value for $XT_{hold}$ may be utilized that results in a $DATA_{IN}$ that is equal to $DATA_{OUT}$. In these embodiments, $XT_{setup}$ is held constant while adjusting $XT_{hold}$ until $DATA_{IN}$ does not equal $DATA_{OUT}$. Thus, $T_{hold}$ corresponds to the value of $XT_{hold}$ resulting in $DATA_{IN \neq} DATA_{OUT}$.

Figure 5A:
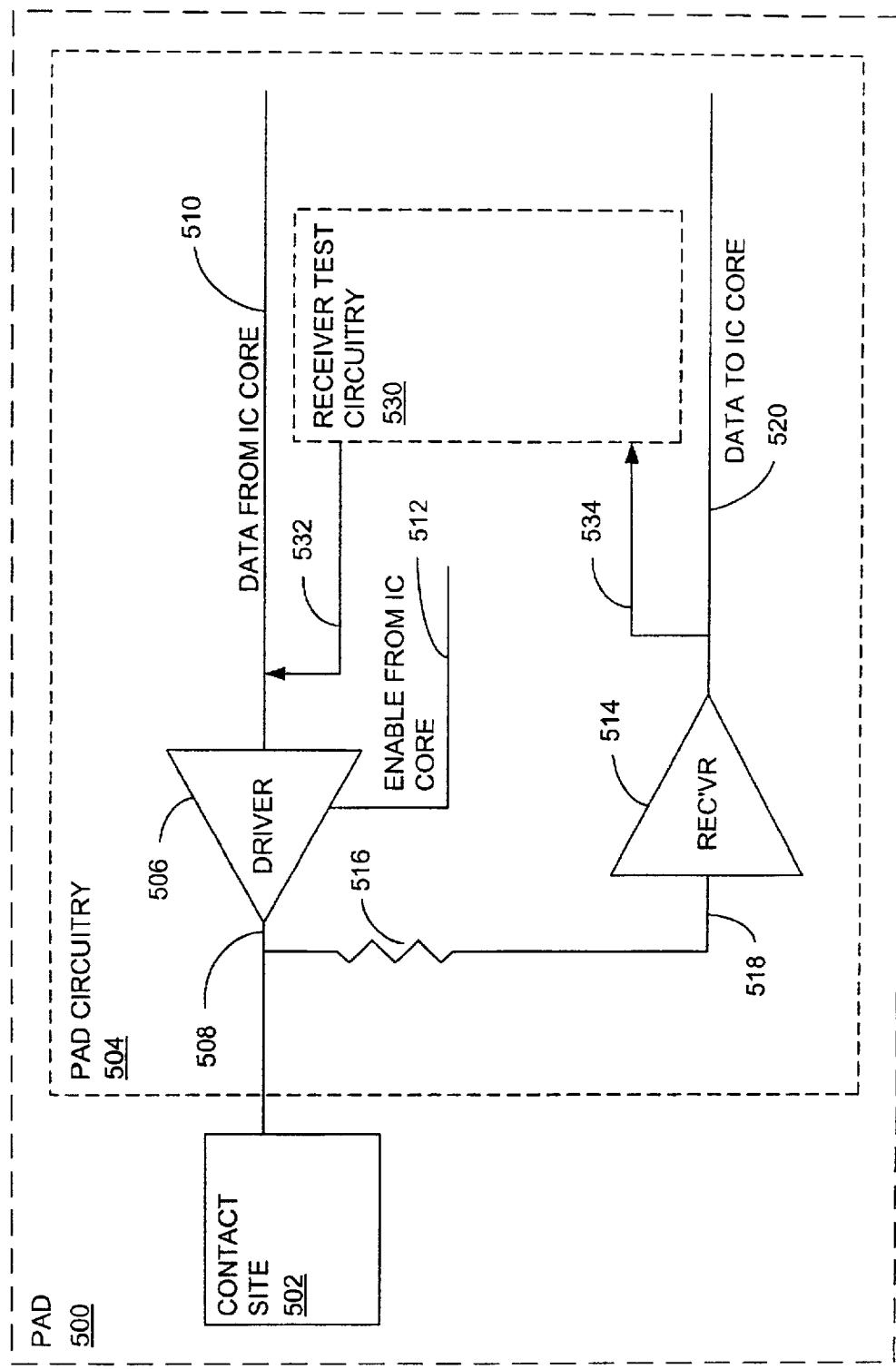
FIG. 5A is a schematic diagram depicting a preferred embodiment of the present invention.

Reference will now be made to FIG. 5A, which depicts a preferred embodiment of the present invention. As shown in FIG. 5A, a pad 500 of an integrated circuit includes both a contact site, e.g., contact site 502, and pad circuitry associated with the contact site, e.g., pad circuitry 504. Circuitry 504 includes a driver 506 that electrically communicates with the contact site 502, such as by lead 508. Driver 506 is configured to receive a data signal 510 from the IC core and a driver enable signal 512 from the IC core. Driver 506 also is electrically interconnected to a receiver 514 with an optional resistor 516 being coupled therebetween. Receiver 514 is configured to receive an input, such as via lead 518, and is configured to provide an output, such as via lead 520, to the IC core of the integrated circuit.

FIG. 5A also depicts a preferred embodiment of receiver test circuitry 530 of the present invention. More specifically, receiver test circuitry 530 is configured to communicate with the driver input, depicted by arrow 532, and with the receiver output, depicted by arrow 534. Receiver test circuitry 530 is configured to provide the receiver with an input data signal, i.e., a logic "0" or a logic "1," for a time period of $XT_{setup}+XT_{hold}$ as described hereinbefore. Additionally, receiver test circuitry 530 is configured to determine or capture an output data signal of the receiver corresponding to the input data signal.

Figure 5B:
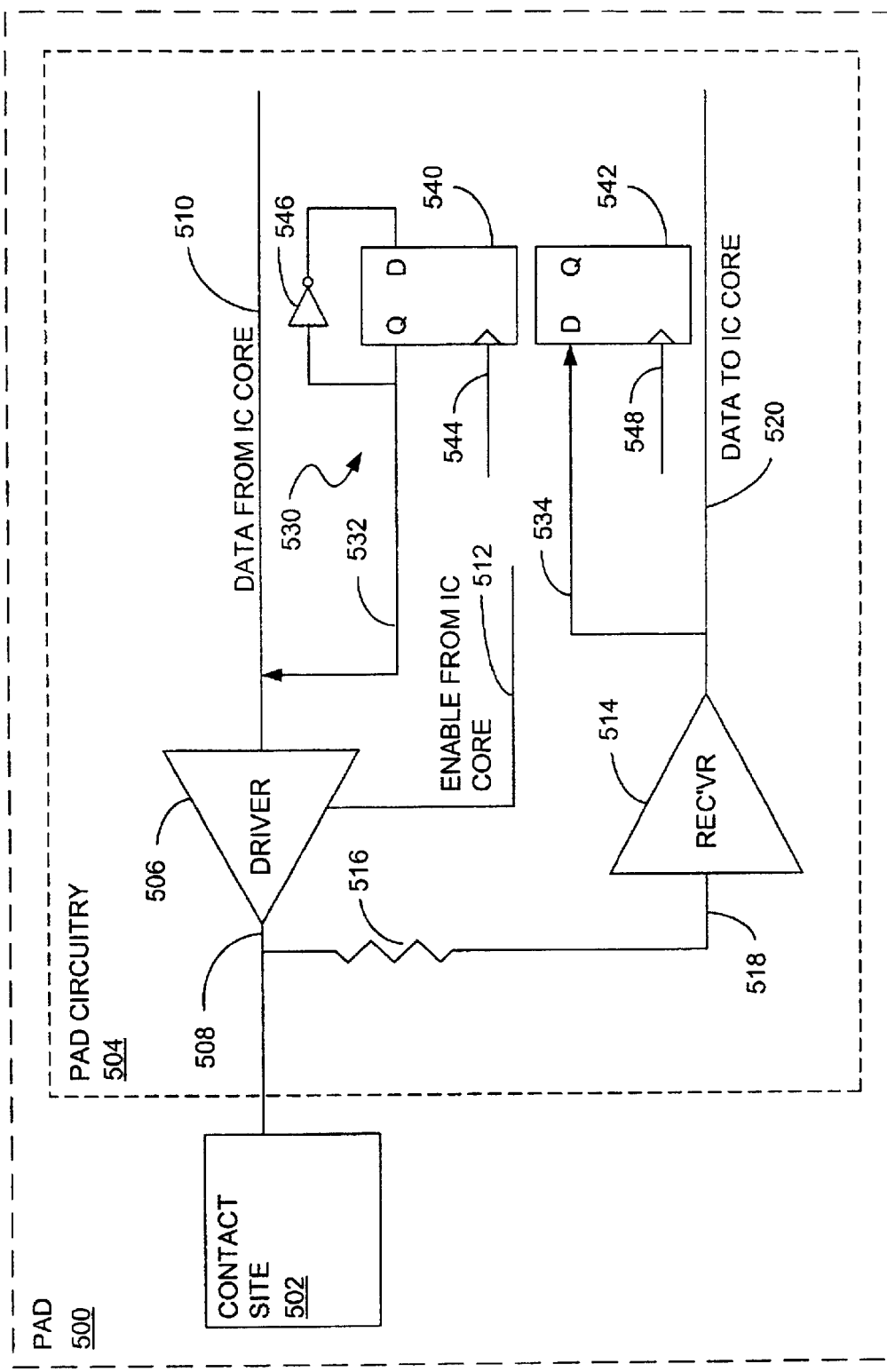
FIG. 5B is a schematic diagram of the embodiment shown in FIG. 5A, depicting detail of a preferred circuit implementation.

Referring now to FIG. 5B, a preferred embodiment of receiver test circuitry 530 will be described in greater detail. As depicted in FIG. 5B, a preferred embodiment of receiver test circuitry 530 includes a launch flip-flop 540 and a capture flip-flop 542. Launch flip-flop 540 is adapted to receive a launch clock signal 544 and, in response thereto, provide an inverted data signal to the input of driver 506. For example, the Q output of flip-flop 540 is provided to inverter 546. Thus, the rising edge of the launch clock signal causes a transition on the Q output of the launch flip-flop.

Capture flip-flop 542 electrically communicates with the output of receiver 514. Capture flip-flop 542 is adapted to receive a capture clock signal 548 and, in response thereto, capture the output data signal of the receiver 514. Firing of the launch and capture clocks may be controlled by an internal timing generator, an external tester or other appropriate device(s) (not depicted in FIG. 5B), provided that time differences between the clocks are known and/or are controllable.

Figure 6:
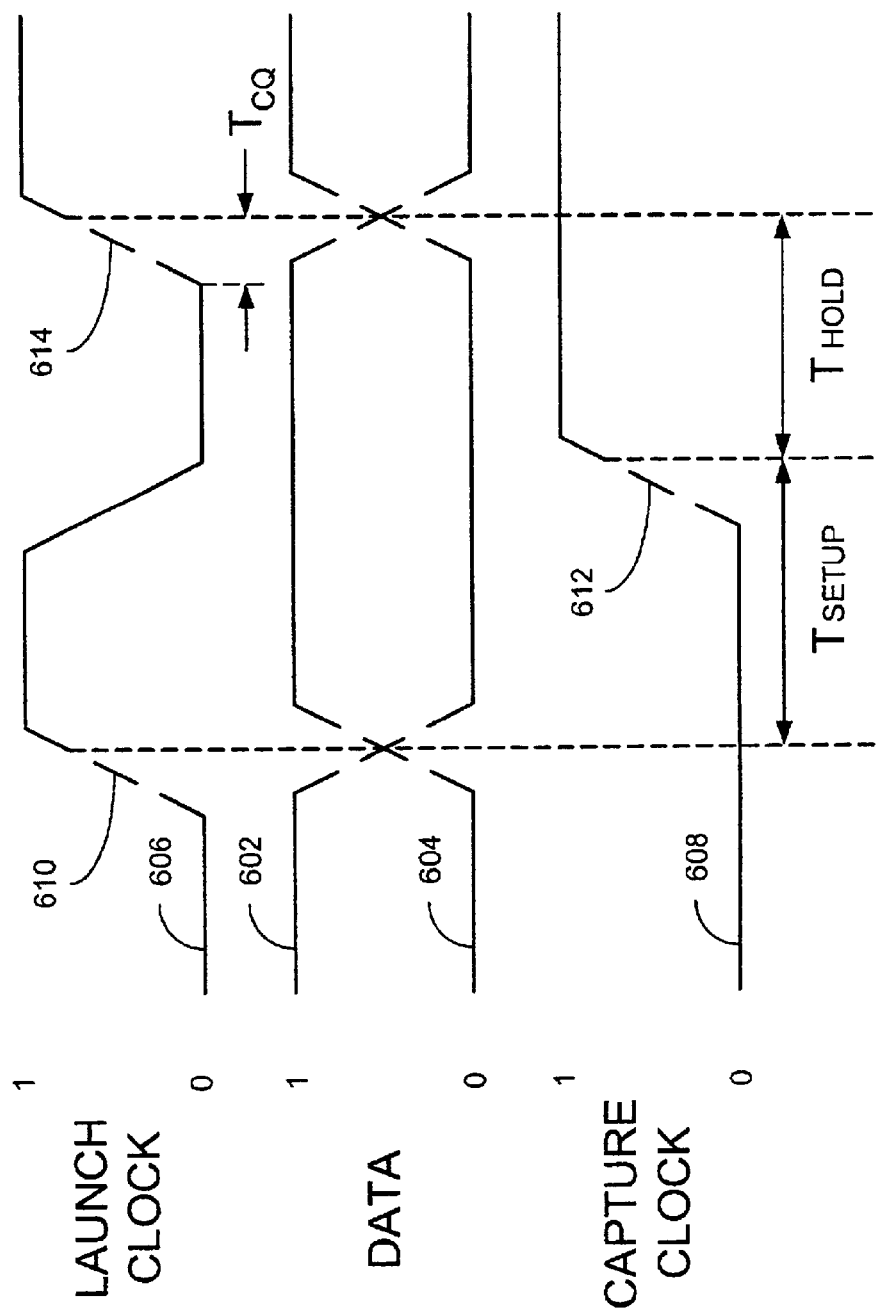
FIG. 6 is a timing diagram depicting functionality of the embodiment shown in FIGS. 5A and 5B.

Operation of the embodiment depicted in FIG. 5B will now be described in relation to the timing diagram of FIG. 6, which depicts representative data signals 602 and 604, launch clock signal 606, and capture clock signal 608. As shown in FIG. 6, the first rising edge 610 of the launch clock causes a transition of the data. The capture clock then is fired, e.g., rising edge 612 of the capture clock is provided. By analyzing the time difference between the rising edge 610 and the rising edge 612 (in relation to the data signal), $T_{setup}$ may be determined. Subsequently, second rising edge 614 of the launch clock causes another transition of the data. Thereafter, the time difference between the rising edge 612 and the rising edge 614 may be utilized to determine $T_{hold}$. It should be noted that the clock-to-q delay ($T_{CQ}$) of the launch flip-flop should be taken into consideration when determining actual $T_{setup}$ and $T_{hold}$.

Figure 7:
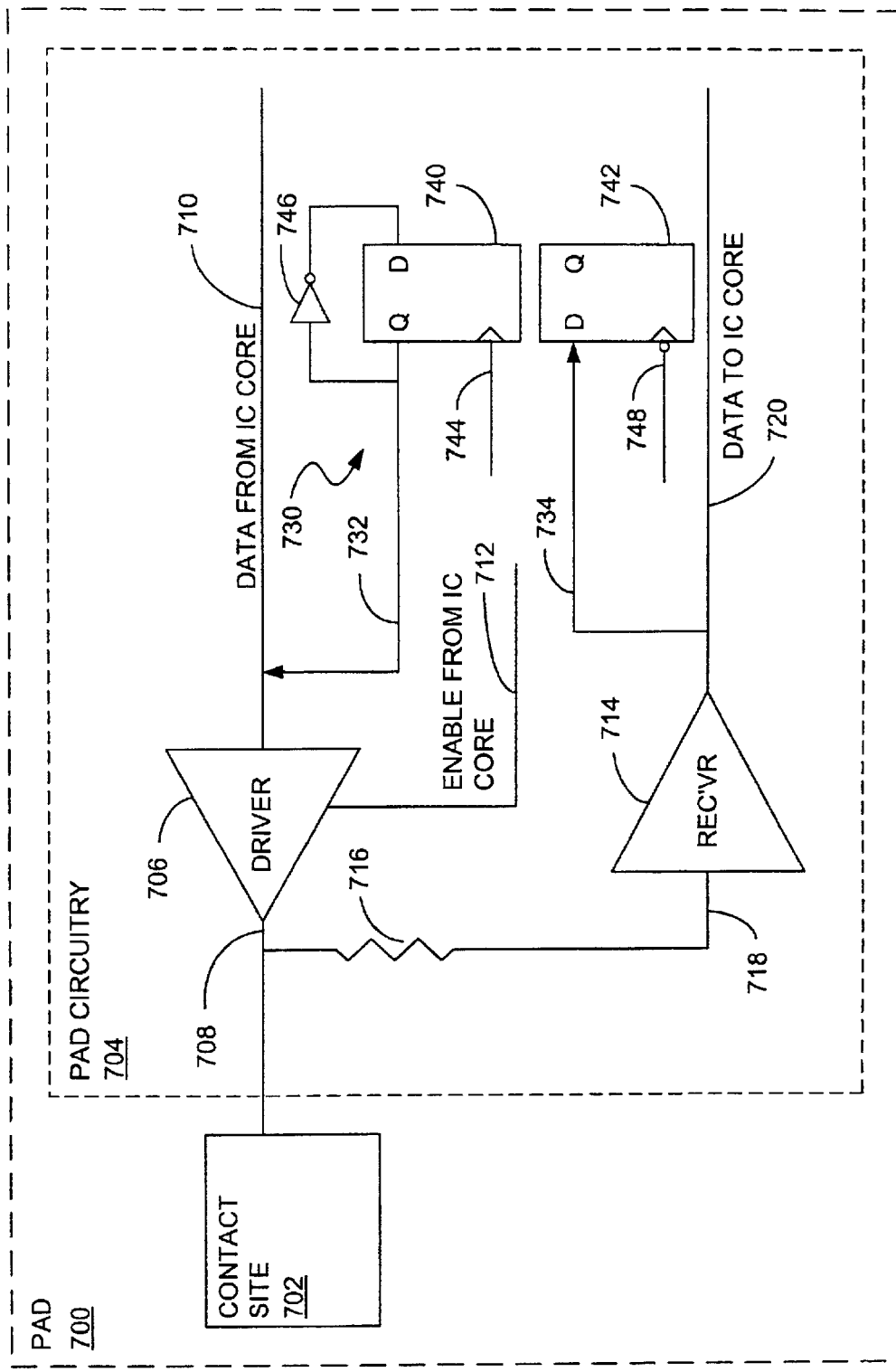
FIG. 7 is a schematic diagram depicting an alternative embodiment of the present invention.

Reference will now be made to FIG. 7, which depicts an alternative embodiment of the present invention. As depicted in FIG. 7, a pad 700 of an integrated circuit includes contact site 702 and pad circuitry 704. Circuitry 704 includes a driver 706 that electrically communicates with the contact site 702, such as by lead 708. Driver 706 is configured to receive a data signal 710 from the IC core and a driver enable signal 712 from the IC core. Driver 706 also is electrically interconnected to a receiver 714, with an optional resistor 716 being coupled therebetween. Receiver 714 is configured to receive an input, such as via lead 718, and is configured to provide an output, such as via lead 720, to the IC core of the integrated circuit.

Receiver test circuitry 730 is configured to communicate with the driver input, depicted by arrow 732, and with the receiver output, depicted by arrow 734. Receiver test circuitry 730 includes a launch flip-flop 740 and a capture flip-flop 742. Launch flip-flop 740 is adapted to receive a clock signal 744 and, in response thereto, provide an inverted data signal to the input of driver 706. For example, the Q output of flip-flop 740 is provided to inverter 746. Thus, the rising edge of the launch clock signal causes a transition on the Q output of the launch flip-flop.

Capture flip-flop 742 electrically communicates with the output of receiver 714. Preferably, capture flip-flop 742 is negative-edge triggered, so that a falling edge of the clock enables the capture flip-flop 742 to capture the output data signal of the receiver 714.

Figure 8:
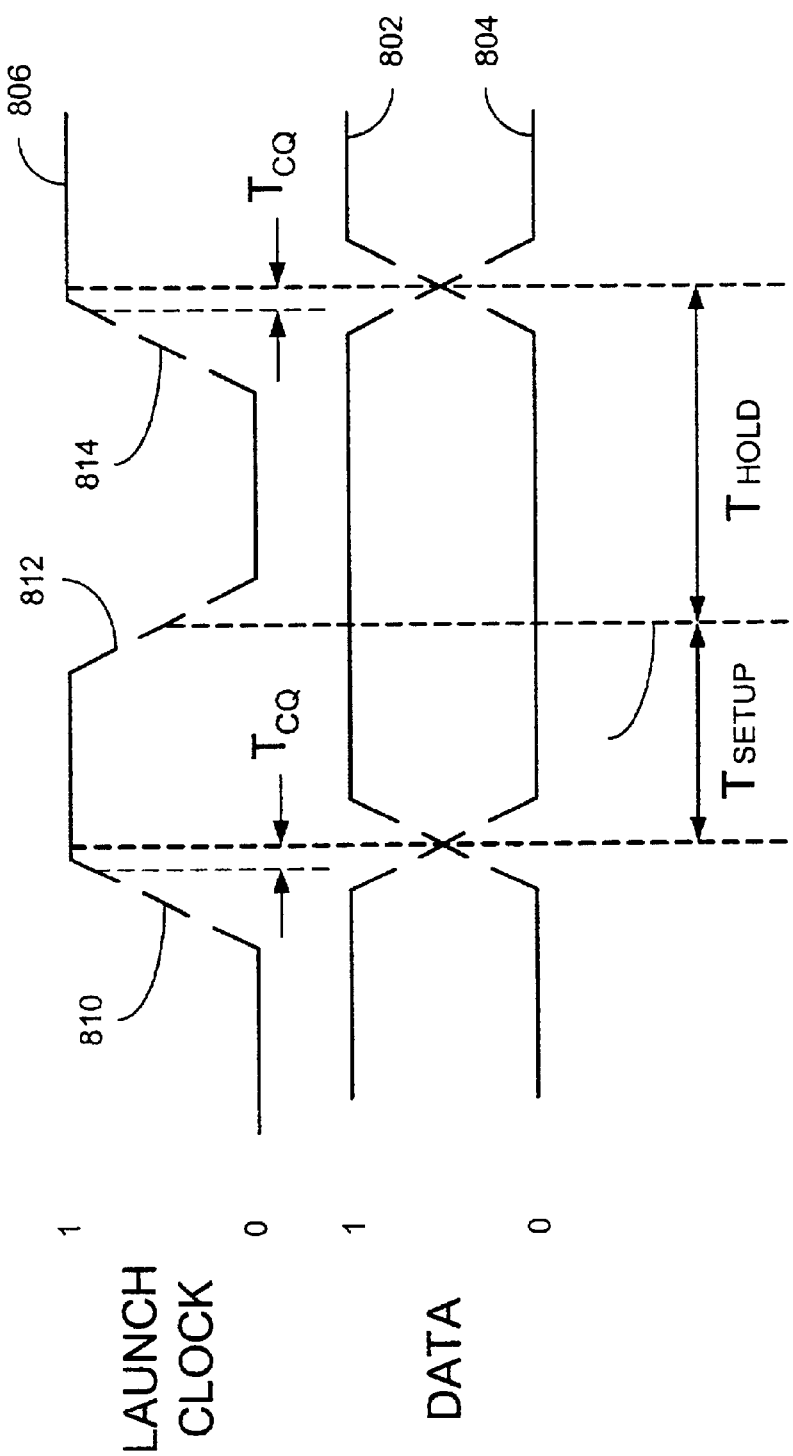
FIG. 8 is a timing diagram depicting functionality of the embodiment shown in FIG. 7.

Operation of the embodiment depicted in FIG. 7 will now be described in relation to the timing diagram of FIG. 8, which depicts representative data signals 802 and 804, and launch clock signal 806. As shown in FIG. 8, the first rising edge 810 of the launch clock causes a transition of the data. Thereafter, the falling edge 812 of the launch clock enables the data to be captured. By analyzing the time difference between the rising edge 810 and the falling edge 812 (in relation to the data signal), $T_{setup}$ may be determined. Subsequently, second rising edge 814 of the launch clock causes another transition of the data. Thereafter, the time difference between the falling edge 812 and the rising edge 814 may be utilized to determine $T_{hold}$. It should be noted that the clock-to-q delay ($T_{CQ}$) of the launch flip-flop should be taken into consideration when determining actual $T_{setup}$ and $T_{hold}$.

Figure 9:
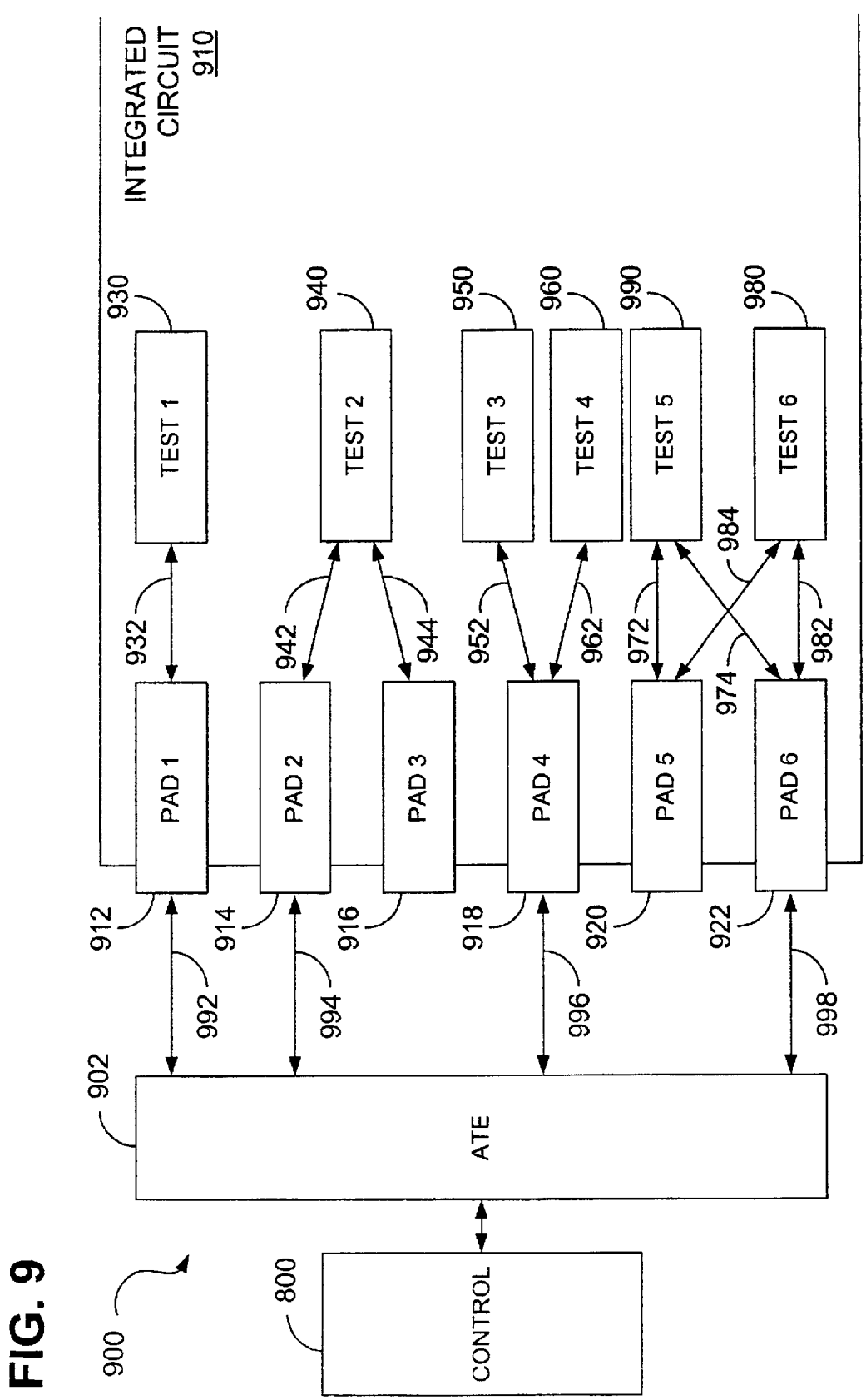
FIG. 9 is a schematic diagram depicting a preferred embodiment of the present invention.

Referring now to FIG. 9, various aspects of the present invention, including receiver test circuitry implementation and calibration will now be described in greater detail. As shown in FIG. 9, a preferred embodiment 900 of the present invention incorporates an integrated circuit 910 which includes multiple pads. In particular, integrated circuit 910 includes pads 1 through 6 (912, 914, 916, 918, 920 and 922 respectively). As depicted in FIG. 7, the integrated circuit also incorporates various receiver test circuits, such as Test 1 (930), Test 2 (940), Test 3 (950), Test 4 (960), Test 5 (970) and Test 6 (980). The various receiver test circuits electrically communicate with their respective pads in a variety of configurations. For instance, circuitry 930 communicates directly with pad 912 via transmission path 932 (in a preferred implementation, path 932 may be two unidirectional paths); circuitry 940 communicates with each of pads 914 and 916 by utilizing transmission paths 942 and 944 respectively; circuitry 950 and circuitry 960 each electrically communicate with pad 918 via transmission paths 952 and 962 respectively; circuitry 970 communicates with pads 920 and 922 via transmission path 972 and 974 respectively; and circuitry 980 also communicates with pads 920 and 922, albeit, via transmission path 982 and 984 respectively. Thus, an integrated circuit may incorporate various pad types as well as various configurations of intercommunication between the various pads and various receiver test circuits.

As an illustrative example, and not for the purpose of limitation, an integrated circuit may be configured to utilize one receiver test circuit to test multiple pads, e.g., utilizing one receiver test circuit to test multiple pads of like type. Such a configuration is represented schematically in FIG. 9 by Pad 2 and Pad 3, which are both tested by Test 2.

As shown in FIG. 9, ATE 902 electrically communicates with the test circuitry of integrated circuit 910 by utilizing a variety of transmission path configurations. For example, circuitry 930 communicates with the ATE via transmission path 932, pad 912 and transmission path 992; circuitry 940 communicates with the ATE via transmission path 942, pad 914 and transmission path 994; circuitry 950 communicates with the ATE via transmission path 952, pad 918 and transmission path 997; circuitry 960 communicates with the ATE via transmission path 962, pad 918 and transmission path 996; circuitry 970 communicates with the ATE via transmission path 974, pad 922 and transmission path 998; and circuitry 980 communicates with the ATE via transmission path 982, pad 922 and transmission path 998. Additionally, various functionality may be enabled by control 1000 (described in detail hereinafter).

As described hereinbefore, the present invention is adapted to facilitate automated test equipment functionality for testing integrated circuits. In this regard, some embodiments of the present invention may be construed as providing receiver test systems for testing integrated circuits. More specifically, some embodiments of the receiver test system may include one or more receiver test circuits in combination with ATE, e.g., ATE 900 of FIG. 9, and a suitable control system, which may be implemented by control 1000 of FIG. 9, for example. The control system may be implemented in hardware, software, firmware, or a combination thereof. In a preferred embodiment, however, the control system is implemented as a software package, which can be adaptable to run on different platforms and operating systems as shall be described further herein. In particular, a preferred embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 10:
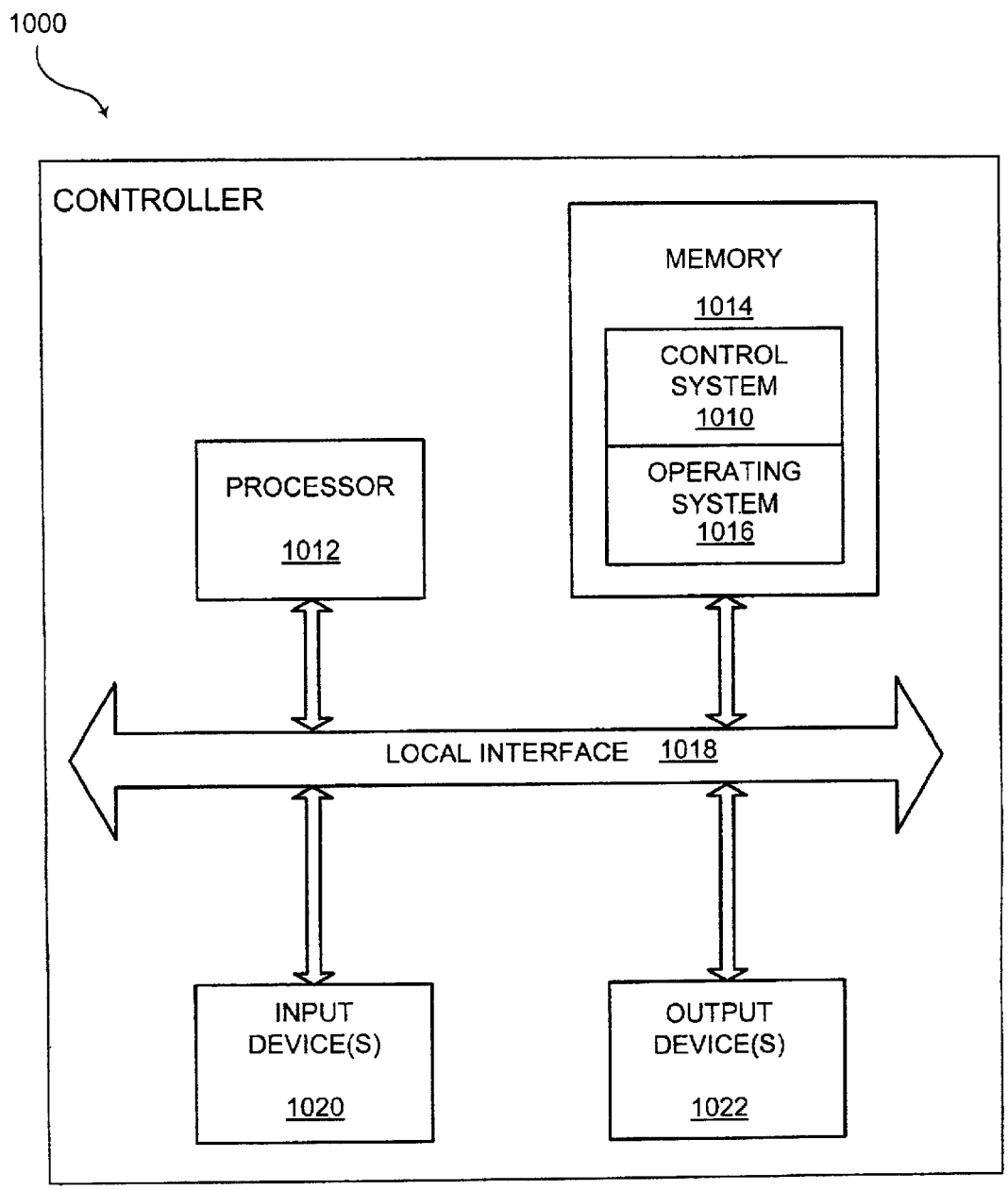
FIG. 10 is a schematic diagram depicting a representative processor-based system which may be utilized as a controller of the present invention.

FIG. 10 illustrates a typical computer or processor-based system which may facilitate functionality of the control system 1010 (described in detail hereinafter) of the present invention, and thereby may be employed as a controller, e.g., controller 1000 of FIG. 9. As shown in FIG. 10, the computer system generally comprises a processor 1012 and a memory 1014 with an operating system 1016. Herein, the memory 1014 may be any combination of volatile and nonvolatile memory elements, such as random access memory or read only memory. The processor 1012 accepts instructions and data from memory 1014 over a local interface 1018, such as a bus(es). The system also includes an input device(s) 1020 and an output device(s) 1022. Examples of input devices may include, but are not limited to, a serial port, a scanner, or a local access network connection. Examples of output devices may include, but are not limited to, a video display, a Universal Serial Bus, or a printer port. Generally, this system may run any of a number of different platforms and operating systems, including, but not limited to, HP-UX™, Linux™, Unix™, Sun Solaris™ or Windows NT™ operating systems. The control system 1010 of the present invention, the functions of which shall be described hereinafter, resides in memory 1014 and is executed by the processor 1012.

Figure 11:
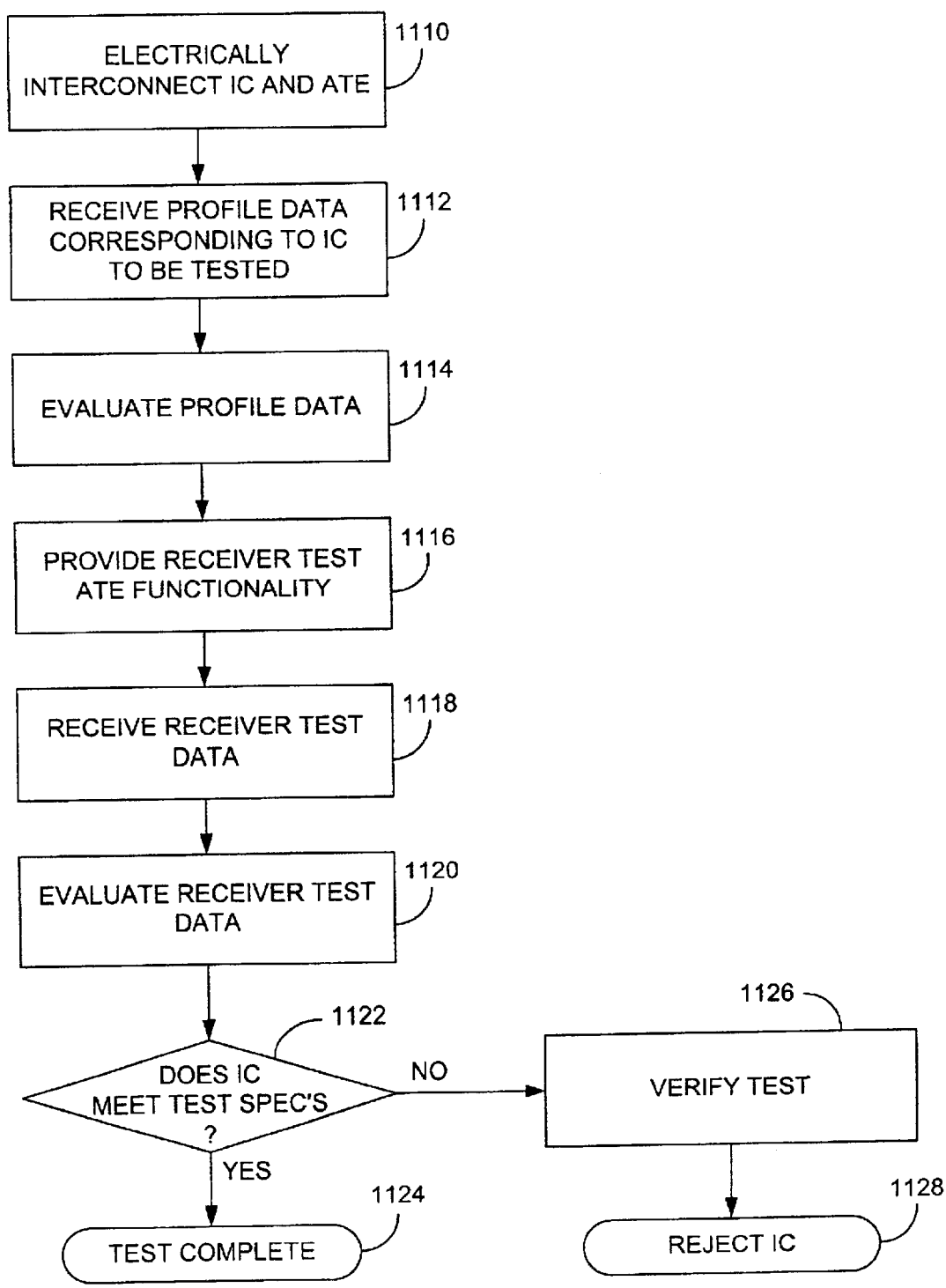
FIG. 11 is a flowchart depicting the functionality of a preferred embodiment of the present invention.

The flowchart of FIG. 11 shows the functionality and operation of a preferred implementation of the control system 1010 depicted in FIG. 10. In this regard, each block of the flowchart represents a module segment or portion of code which comprises one or more executable instructions for implementing the specified logical function or functions.

It should also be noted that in some alternative implementations the functions noted in the various blocks may occur out of the order depicted in FIG. 11. For example, two blocks shown in succession in FIG. 11 may, in fact, be executed substantially concurrently where the blocks may sometimes be executed in the reverse order depending upon the functionality involved.

As depicted in FIG. 11, the control system functionality (or method) preferably begins at block 1110 where an IC to be tested is electrically interconnected with ATE. Proceeding to block 1112, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 1114 where the data is evaluated, i.e., a determination is made as to whether testing may proceed.

At block 1116, the IC under test is provided, by the ATE, with appropriate signals to facilitate receiver testing, such as receiver $T_{setup}$ and $T_{hold}$ for instance. At block 1118, test data is received, such as by the ATE, with the data being received in any suitable manner, e.g., intermittently throughout the testing cycle, or after testing has been completed. At block 1120, where receiver data is evaluated and, then, in block 1122, a determination may be made as to whether the receiver, and its associated components, are functioning as desired. If it is determined that the receiver is not functioning as desired, the process may proceed to block 1126 where the test results may be verified, such as by repeating at least some of the aforementioned process steps 1110–1122. Thereafter, if the determination once again is made that the integrated circuit is not functioning as desired, the process may proceed to block 1128 where the integrated circuit may be rejected. If, however, it is determined that the integrated circuit is functioning as desired, the process may proceed to block 1124 where the process may terminate.

As is known, when ATE is used to test an integrated circuit, the ATE should be calibrated to ensure that it is providing accurate measurements. As the present invention provides at least selected ATE functionality, calibration of the receiver test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 12:
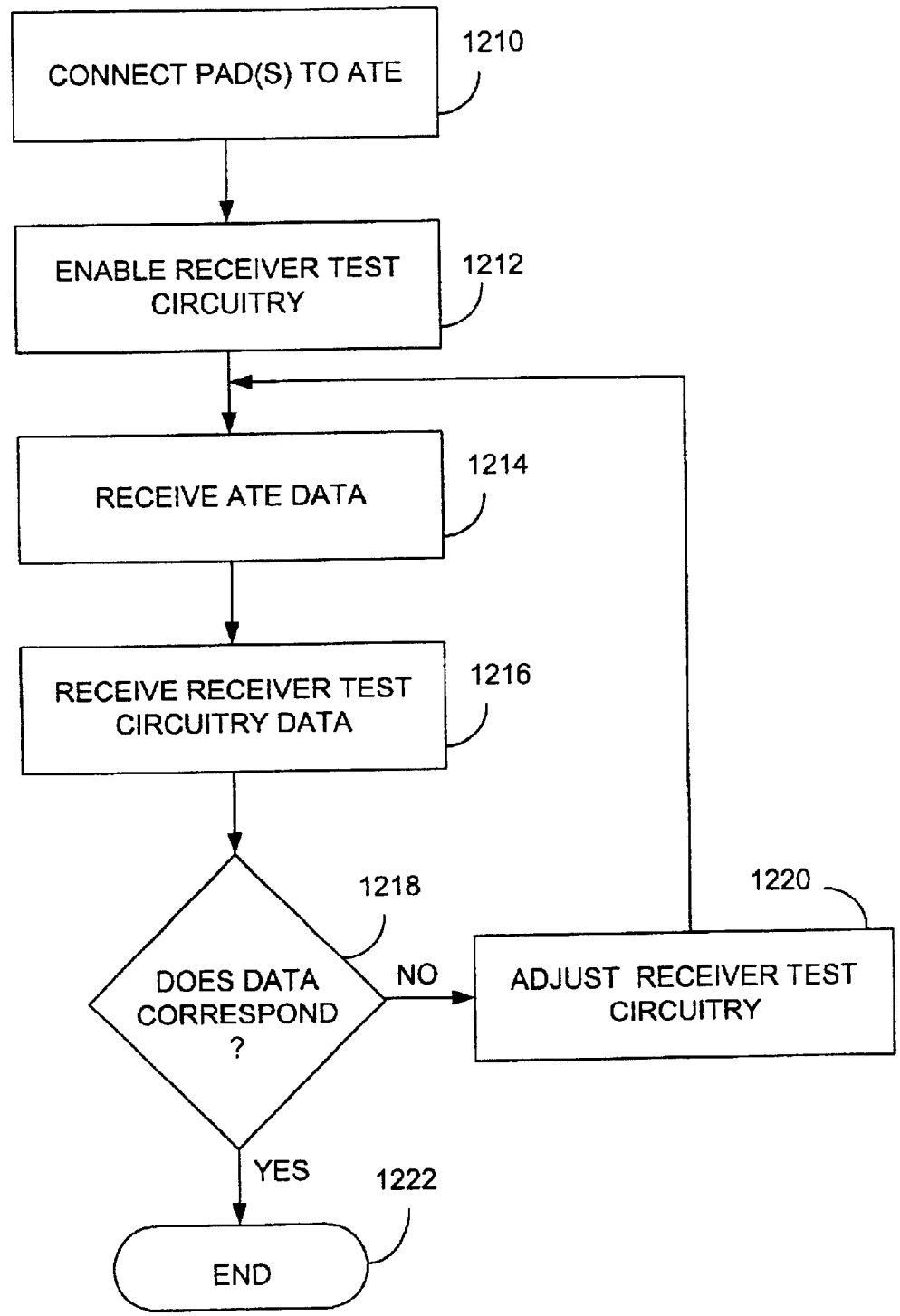
FIG. 12 is a flowchart depicting the functionality of a preferred embodiment of the present invention during calibration.

Since, it is preferable to calibrate the receiver test circuitry of the present invention, the following preferred calibration method is provided for the purpose of illustration, and not for the purpose of limitation. As shown in FIG. 12, a preferred method 1200 for calibrating receiver test circuitry preferably begins at block 1210 where designated pads of an integrated circuit to be tested are connected to ATE. Preferably, when a circuit design, e.g., a pad, is used multiple times within an IC, identical receiver test circuitry is associated with each instance of that circuit design. When so configured, connecting of the pads to the ATE, such as depicted in block 1210, preferably includes merely connecting the ATE to one or more instances of the circuit design. Since different instances of the repeated circuit design are assumed to be identical in their defect-free electrical behavior, measurements made on the ATE-connected instance of the circuit design may be assumed to correlate to the measurements made at other instances of that circuit design. It should be noted, however, that since each identical instance of the block is assumed to have identical defect-free electrical behavior, only one non-connective pad of each pad type need be utilized, although additional ones of the pads may be utilized for added error detection and comparison.

Proceeding to block 1212, receiver test circuitry is enabled. With both ATE and the appropriate receiver test circuitry now enabled, measurements, such as $T_{setup}$ and $T_{hold}$, for example, may be taken by either or both of the ATE and the receiver test circuitry. Thus, as depicted in blocks 1214 and 1216, the process includes the steps of receiving ATE measurements and receiving receiver test circuitry measurements, respectively. At block 1218, a determination may be made as to whether the ATE measurement data and the receiver test circuitry data appropriately correspond, thereby indicating proper calibration of the receiver test circuitry. If, however, it is determined that the measurements do not correspond, the process may proceed to block 1220 where the receiver test circuitry measurements may be adjusted to match those measurements obtained from the ATE. Thereafter, the process may proceed back to block 1214 and proceed as described hereinbefore until the receiver test circuitry measurements are appropriately calibrated. Once appropriate calibration has been achieved, the process may end, such as depicted in block 1222.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), the IC having a first pad configured as a signal interface for components external to the IC, the first pad having a receiver configured to receive a signal from a component external to the IC and to provide a digital signal in response thereto, said method comprising:

electrically interconnecting automated test equipment (ATE) with the IC;

providing at least one stimulus such that the IC measures a receiver setup time and receiver hold time of the first pad; and receiving information corresponding to the receiver setup time and the receiver hold time of the first pad.

2. The method of claim 1, wherein providing at least one stimulus comprises:

providing the at least one stimulus from the ATE.

3. The method of claim 1, wherein providing at least one stimulus comprises:

enabling a first flip-flop of the IC to provide an output signal to the receiver of the first pad; and determining an output of the receiver corresponding to the output signal of the first flip-flop.

4. The method of claim 3, wherein enabling a first flip-flop of the IC to provide an output signal to the receiver of the first pad comprises:

providing a first clock signal to the first flip-flop;

inverting the data output of the first flip-flop in response to the first clock signal; and providing the data output of the first flip-flop to the receiver for a first time interval prior to through a second time interval after a second clock signal.

5. The method of claim 4, wherein determining an output of the receiver comprises:

enabling a second flip-flop to capture the output of the receiver in response to the second clock signal.

6. The method of claim 4, wherein providing the data output of the first flip-flop to the receiver comprises:

varying the first time interval and holding the second time interval constant while determining the receiver setup time; and varying the second time interval and holding the first time interval constant while determining the receiver hold time.

7. The method of claim 6, wherein the step of receiving information corresponding to the receiver setup time and the receiver hold time of the first pad comprises:

observing the second flip-flop to extract information corresponding to the output of the receiver.

8. The method of claim 1, wherein the IC has a plurality of pads, and wherein electrically interconnecting automated test equipment (ATE) with the IC comprises electrically interconnecting the ATE to a subset of the plurality of pads.

9. An integrated circuit (IC) comprising:

a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to the first pad input signal; and a first test circuit internal to said IC and being adapted to provide information corresponding to the receiver setup time and the receiver hold time of the first pad.

10. The IC of claim 9, wherein said first test circuit is configured to receive at least one stimulus from automated test equipment (ATE) such that, in response thereto, said first test circuit provides a data signal to said first receiver of said first pad.

11. The IC of claim 9, wherein said first test circuit has a first flip-flop electrically communicating with said receiver, said first flip flop being configured to provide a data signal to said first receiver for a first time interval prior to through a second time interval after a clock signal.

12. The IC of claim 11, wherein said first test circuit has a second flip-flop configured to register a digital output signal provided by said first receiver in response to said data signal of said first flip-flop.

13. An integrated circuit (IC) comprising:

a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to said first pad input signal; and means for providing information corresponding to the receiver setup time and the receiver hold time of the first pad.

14. The IC of claim 13, wherein said means for providing information includes means for providing a data signal to said first receiver for a first time interval prior to through a second time interval after a clock signal.

15. A system for measuring receiver setup time and the receiver hold time of receivers of an integrated circuit, said system comprising:

automated test equipment (ATE) configured to electrically interconnect with an IC and to provide at least one stimulus to the IC; and an integrated circuit (IC) having a first pad, said first pad having a first driver, a first receiver and a first test circuit, said first driver being configured to provide a first pad output signal to said ATE, said first receiver being configured to receive a first pad input signal from said ATE and to provide, to a component internal to said IC, a first receiver digital output signal in response to said first pad input signal, said first test circuit being configured to electrically communicate with said ATE such that, in response to receiving said at least one stimulus from said ATE, said first test circuit provides information, corresponding to the receiver setup time and the receiver hold time of said first receiver of said first pad, to said ATE.

16. The system of claim 15, wherein said IC has a plurality of pads, said ATE is configured to electrically interconnect with a subset of said plurality of pads, and said system is configured to measure the receiver setup time and the receiver hold time of each receiver of each of said plurality of pads while said ATE is electrically interconnected with said subset of pads.

17. A computer readable medium having a computer program for facilitating measuring of the receiver setup time and the receiver hold time of receivers of an integrated circuit (IC), the IC having a first pad and a first test circuit, the first pad being configured as a signal interface for components external to the IC, the first pad having a receiver configured to receive a signal from a component external to the IC and to provide a digital signal in response thereto, the first test circuit being internal to the IC and being adapted to provide information corresponding to at least one of the receiver setup time and the receiver hold time of the first receiver, said computer readable medium comprising:

logic configured to enable automated test equipment (ATE) to provide at least one stimulus to the IC such that the first test circuit provides information corresponding to the receiver setup time and the receiver hold time of the first receiver; and logic configured to enable the ATE to receive, from the first test circuit, the information corresponding to the receiver setup time and the receiver hold time of the first receiver.

* * * * *